United States Patent [19]

Williams et al.

[11] 4,001,689
[45] Jan. 4, 1977

[54] DEVICE FOR INDICATING THE DIRECTION OF ROTATION OF A BODY DRIVEN BY A ROTATING ELECTRICAL MACHINE

[75] Inventors: John Llewellyn Williams, Chester; Phillip John Stokes, Liverpool, both of England

[73] Assignee: British Nuclear Fuels Limited, England

[22] Filed: July 2, 1975

[21] Appl. No.: 592,627

[30] Foreign Application Priority Data

July 8, 1974    United Kingdom ............. 30263/74

[52] U.S. Cl. .............................. 324/34 D; 324/165; 324/158 MG; 340/271
[51] Int. Cl.² .................... G01R 33/02; G01B 7/00
[58] Field of Search ............ 324/34 D, 34 PS, 163, 324/165, 167, 173, 177, 158 MG; 340/271; 310/168, 111

[56] References Cited

UNITED STATES PATENTS

| | | | |
|---|---|---|---|
| 1,111,345 | 9/1914 | Wood | 324/165 |
| 3,188,620 | 6/1965 | Mac Callum | 340/271 |
| 3,404,339 | 10/1968 | Mitchell | 324/173 |
| 3,728,565 | 4/1973 | O'Callaghan | 324/165 |
| 3,943,504 | 3/1976 | Vosicky | 324/34 R |

FOREIGN PATENTS OR APPLICATIONS 780,036    7/1957    United Kingdom ............... 324/173

OTHER PUBLICATIONS

Koppitz, Frank; Drehzahlmessung etc.; Archiv fur Technesches Messen; V. 145-12; pp. 121-122.

*Primary Examiner*—Robert J. Corcoran
*Attorney, Agent, or Firm*—Larson, Taylor and Hinds

[57] ABSTRACT

A device for indicating the direction of rotation of a rotating body forming part of or associated with rotating electrical machine comprises the combination of a probe unit positioned to interrupt magnetic lines of force generated by the electrical machine, a detector for interpreting signals from the probe unit, and an indicator, which can be a center zero current meter or an oscilloscope, for displaying direction of rotation.

4 Claims, 4 Drawing Figures

4,001,689

DEVICE FOR INDICATING THE DIRECTION OF ROTATION OF A BODY DRIVEN BY A ROTATING ELECTRICAL MACHINE

BACKGROUND OF THE INVENTION

This invention relates to devices for indicating the direction of rotation of a rotating body forming part of or associated with a rotating electrical machine, which body is wholly enclosed and cannot be seen, or where the body is visible, its speed of rotation is too great for the direction to be ascertainable by vision alone.

SUMMARY OF THE INVENTION

According to the invention, for indicating the direction of rotation of a rotating body forming part of or associated with a rotating electrical machine, a device comprises a probe unit adapted to be positioned in proximity to the rotating body for interrupting magnetic lines of force generated by the electrical machine, a detector circuit in which the probe unit is included, and an indicator fed by the detector circuit and adapted to indicate the direction of rotation of said electrical machine and hence of said body.

The probe unit preferably comprises two inductive probes spaced so that the signals produced by the probes when interrupting the magnetic field manifest by said magnetic lines of force differ in phase, the difference being sensed by the detector circuit and indicated by the indicator.

The indicator may be a centre zero current detecting meter. Alternatively the indicator may be, with a suitably modified detector circuit, an oscilloscope, from which the speed of the rotating body can be interpreted. The modifications to the detector circuit may include filtering circuitry so as to provide the oscilloscope with an easily identifiable trace.

The detector circuit may be provided with variable discrimination by having selectively variable frequency, eg at 50, 100 and 1000 Hz.

DESCRIPTION OF THE DRAWINGS

An example of a device according to the invention is illustrated in the accompanying drawings, wherein.

DESCRIPTION OF THE PREFERRED EMBODIMENT

Figure 1:
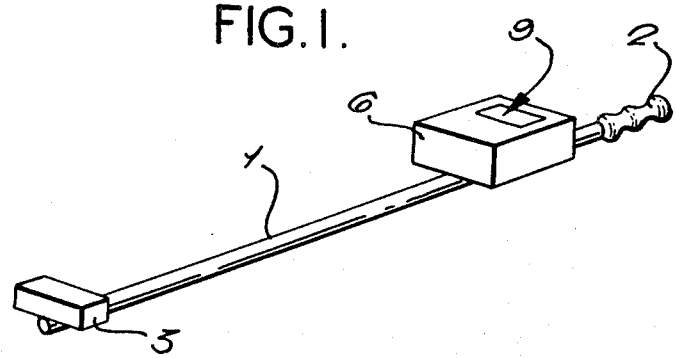
FIG. 1 is a perspective view of the exemplified device.
Figure 2:
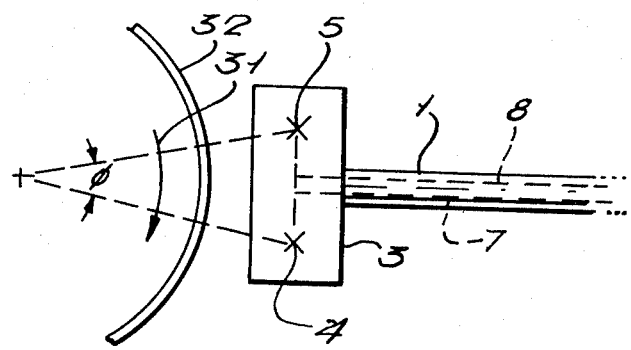
FIG. 2 is a fragmentary plan view of part of the device, shown applied in proximity to a rotating body.

Referring to the drawings, we provide a device which is portable and consists of a tube 1 having a handle 2 at one end and a rectangular box 3 at its other end, the box 3 being arranged so as to project laterally and symmetrically from the tube 1 as can be seen in FIGS. 1 and 2.

Figure 3:
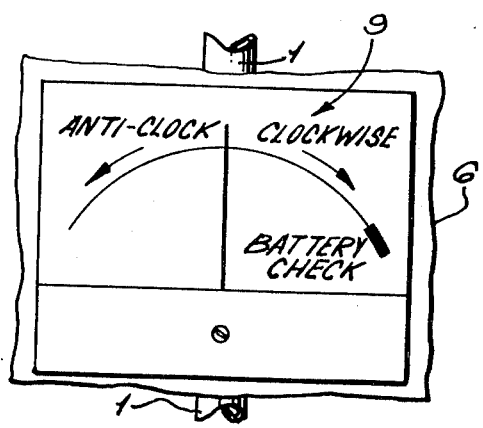
FIG. 3 is an enlarged plan view of a detail of FIGS. 1 and 2.
Figure 4:
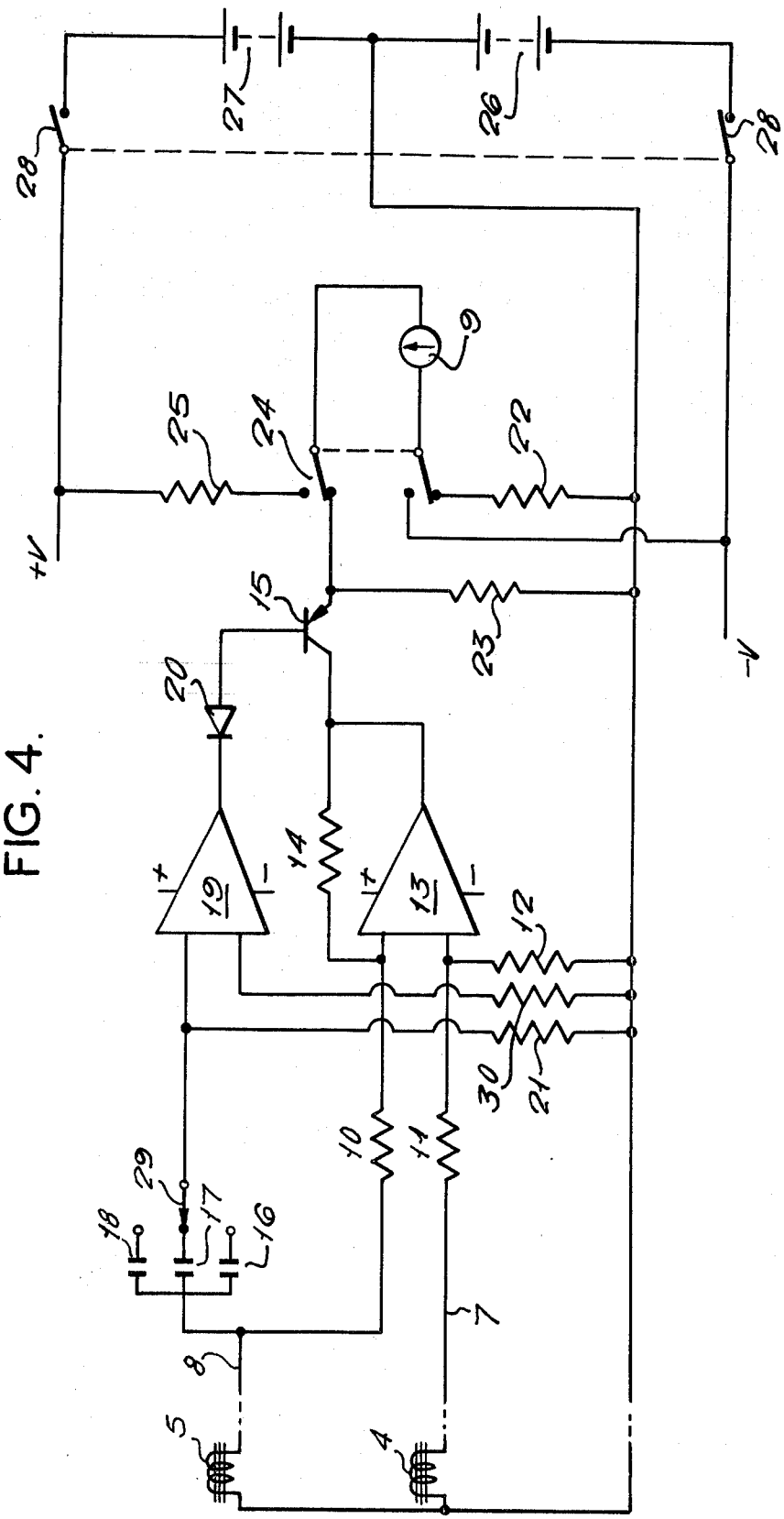
FIG. 4 is a circuit diagram of the circuitry included in the device shown in FIGS. 1 and 2.

The box 3 contains two spaced electromagnetic pickups 4 and 5 respectively (FIG. 4), these pick-ups serving as probes whose positions are indicated in FIG. 2 by the crosses to which the reference numerals 4 and 5 are applied. Circuitry shown in FIG. 4 and to be described is contained in a rectangular box 6 larger than the box 3 and secured to the tube 1 near the handle end thereof, the tube 1 carrying within its bore leads 7, 8 from the pick-ups (probes) 4, 5 respectively. The box 6 includes in a position visible to an operator holding the device by its handle 2, a centre zero ammeter 9, shown particularly in FIG. 3, but also included in the circuitry shown in FIG. 4, which serves to indicate by the deflection of the needle to left or right (referring to FIG. 3) whether rotation of a magnetic field producing body in which field the probes are disposed as shown in FIG. 2, is anti-clockwise or clockwise respectively. The box 6 also includes the remainder of the detector circuitry and the electrical storage batteries.

The detector circuitry is a conventional phase detector circuit in which the signals from the inductive pickups 4, 5 are differentially connected via resistors 10, 11, 12 to an integrated amplifier 13, the gain of which is set by a resistor 14. The amplified output is connected to a switching transistor 15 which is controlled by a reference signal obtained from pick-up 5 via one of three phase shifting capacitors 16, 17, 18 respectively (the selection being made by switch 29 and depending on the speed range of the rotating body), resistors 21, 30, integrated amplifier 19, and diode 20. The output signal from the transistor 15 is connected via a switch 24 to the centre-zero ammeter 9 in series with resistor 22. A resistor 23 completes the circuity when ammeter 9 is used via a switch 24 and a resistor 25 to check the condition of batteries 26, 27 respectively. A switch 28 serves to isolate the batteries.

In use (see particularly FIG. 1) for indicating the direction of rotation of a body 2) is associated with or is part of a rotating electrical machine such as a motor possessing a moving magnetic field (shown by arrow 31) and contained within a casing (designated 32), the device is positioned as shown in FIG. 2 so that the pick-up probes 4, 5 define an angle φ which can be thought of as a phase angle. The signals induced in the probes 4, 5 by the magnetic field will differ in phase (by angle φ) and this difference will be sensed by the detector circuitry and be indicated on the ammeter 9 as a direction of rotation.

The device is advantageous in that it gives a rapid and clear indication, is cheap to make, and because it is portable, can be applied to a large number of electrical machines selectively and/or successively as desired.

Instead of the centre-zero ammeter, a bench-mounted oscilloscope can be employed to interpret the signals via long leads from the probes 4, 5 in conventional manner. Conventional filtering circuitry can be included to improve the ability to identify the oscilloscope trace.

We claim:

1. A device for indicating the direction of rotation of a body driven by a rotating electrical machine wherein the body and the machine are located within an enclosure, such device comprising:
    a first inductive probe for positioning in proximity to the rotating body but outside said enclosure so as to interrupt magnetic lines of force generated by the electrical machine,
    a second inductive probe for positioning in proximity to the rotating body but outside said enclosure so as to interrupt magnetic lines of force generated by the electrical machine, said second inductive probe being angularly spaced from first inductive probe so that signals produced by said probes differ in phase, a detector circuit for sensing the difference in phase between the signals produced by said probes, means for applying a selectively variable frequency signal to said detector circuit so as to provide variable discrimination for operating in differing speed ranges of said rotating body, and an indicator connected to said detector circuit for indicating the direction of rotation of said body.

2. A device according to claim 1, wherein the indicator comprises a center zero current detecting meter.

3. A device according to claim 1, wherein the indicator comprises an oscilloscope.

4. A device according to claim 1, wherein said means for applying a selectively variable frequency signal comprises a reference circuit including a plurality of phase-shifting capacitors and switching means for selectively connecting individual ones of said capacitors to said detector circuit.

* * * * *